(12) United States Patent
Sakumura et al.

(10) Patent No.: US 10,255,984 B2
(45) Date of Patent: Apr. 9, 2019

(54) SEMICONDUCTOR DEVICE AND METHOD OF CONTROLLING THE SEMICONDUCTOR DEVICE

(71) Applicant: Renesas Electronics Corporation, Tokyo (JP)

(72) Inventors: Kotaro Sakumura, Tokyo (JP); Yasutaka Horikoshi, Tokyo (JP); Hiroshi Tachibana, Tokyo (JP); Keita Kashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/914,848

(22) Filed: Mar. 7, 2018

(65) Prior Publication Data
US 2018/0336956 A1   Nov. 22, 2018

(30) Foreign Application Priority Data
May 22, 2017 (JP) .................... 2017-100756

(51) Int. Cl.
| | |
|---|---|
| G11C 19/28 | (2006.01) |
| H01L 21/822 | (2006.01) |
| H01L 23/50 | (2006.01) |
| G11C 16/30 | (2006.01) |
| G11C 5/14 | (2006.01) |
| G11C 11/56 | (2006.01) |
| H01L 27/04 | (2006.01) |

(52) U.S. Cl.
CPC ............ G11C 19/28 (2013.01); G11C 5/14 (2013.01); G11C 11/5628 (2013.01); G11C 11/5642 (2013.01); G11C 16/30 (2013.01); *H01L 21/822* (2013.01); *H01L 23/50* (2013.01); *H01L 27/04* (2013.01)

(58) Field of Classification Search
None
See application file for complete search history.

(56) References Cited

U.S. PATENT DOCUMENTS 6,826,705 B2 * 11/2004 Tani .................. G06F 1/26
                                              713/300

FOREIGN PATENT DOCUMENTS

JP        2008-218722 A    9/2008

\* cited by examiner

*Primary Examiner* — Jeffery S Zweizig
(74) *Attorney, Agent, or Firm* — McGinn IP Law Group, PLLC.

(57) ABSTRACT

A malfunction caused by sharp fluctuations in current is prevented while suppressing an increase in circuit size. A semiconductor device includes a plurality of modules. The semiconductor device includes: a table that stores a plurality of operating frequencies in each of the modules and a plurality of scores determined based on the operating frequencies such that the operating frequencies and the scores are associated with each other for each of the modules; a score specifying unit that acquires the clock operating frequencies of the modules and specifies the scores based on the clock operating frequencies with reference to the table; and an output unit that outputs an instruction to activate the modules at different times if the specified scores exceed a predetermined threshold value.

9 Claims, 9 Drawing Sheets

SEMICONDUCTOR DEVICE AND METHOD OF CONTROLLING THE SEMICONDUCTOR DEVICE

CROSS-REFERENCE TO RELATED APPLICATIONS

The disclosure of Japanese Patent Application No. 2017-100756 filed on May 22, 2017 including the specification, drawings and abstract is incorporated herein by reference in its entirety.

The present invention relates to a semiconductor device and a method of controlling the semiconductor device, and relates to, for example, a semiconductor device including a plurality of modules and a method of controlling the semiconductor device.

BACKGROUND

It is known that when power supply switches are turned on in an internal circuit, currents are simultaneously generated so as to cause a malfunction in a semiconductor IC. Japanese Unexamined Patent Application Publication No. 2008-218722 discloses a technique of a rush-current monitoring circuit in a semiconductor IC.

SUMMARY

In this technique, in order to prevent a momentary voltage drop or increase of Vdd in a micro control unit (MCU), a margin may be provided for the capacity of a power supply unit or a MCU internal capacity may be added. However, all these measures have resulted in upsizing of chips. In Japanese Unexamined Patent Application Publication No. 2008-218722, these problems cannot be solved.

Other problems and new characteristics will be clarified by a description of the present specification and the accompanying drawings.

According to an embodiment, a semiconductor device including: a table that stores a plurality of operating frequencies in a plurality of modules and a plurality of scores determined based on the operating frequencies such that the operating frequencies and the scores are associated with each other for each of the modules; a score specifying unit that acquires the clock operating frequencies of the modules and specifies the scores based on the clock operating frequencies with reference to the table; and an output unit that outputs an instruction to activate the modules at different times if the specified scores exceed a predetermined threshold value.

According to the embodiment, a malfunction caused by sharp fluctuations in current can be prevented while suppressing an increase in circuit size.

DETAILED DESCRIPTION

Figure 1:
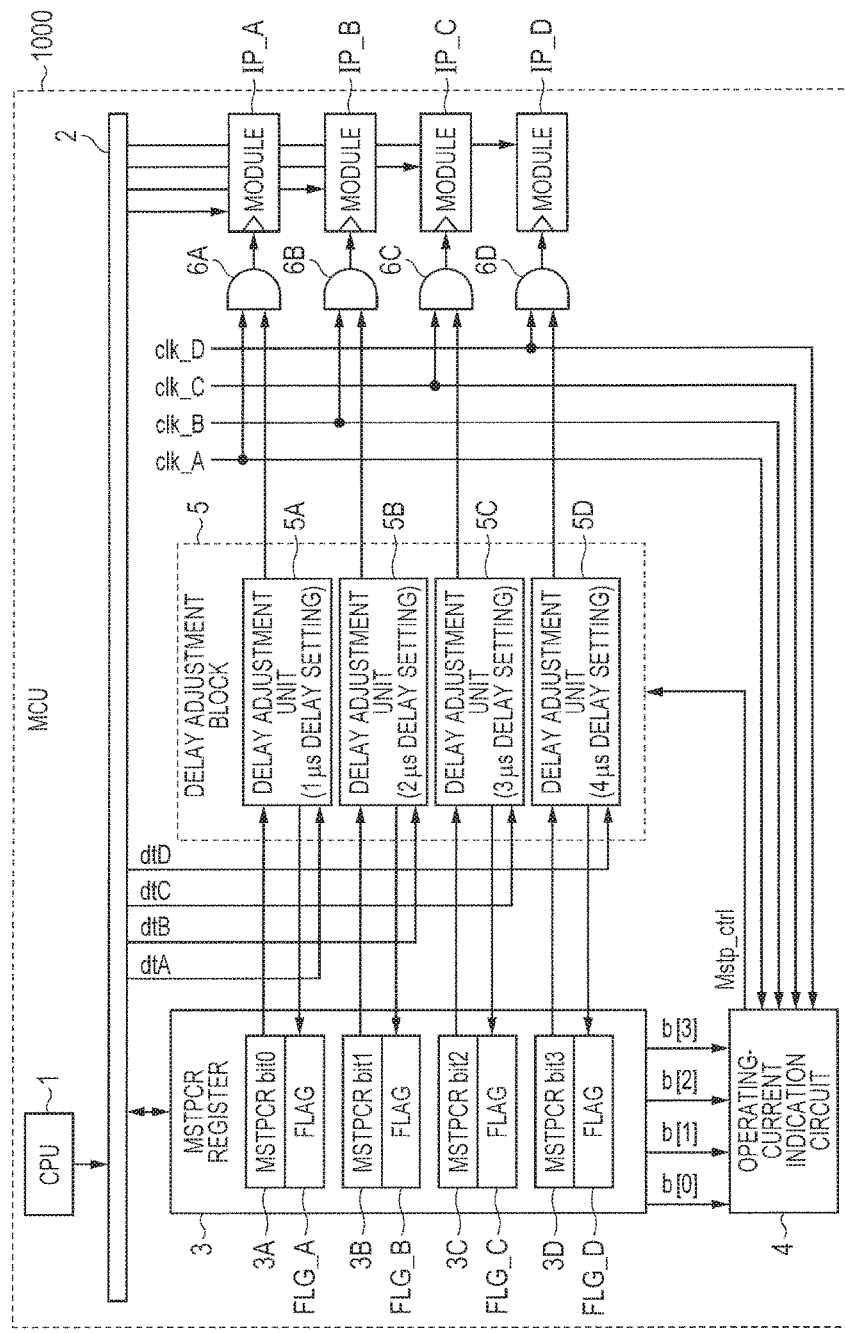
FIG. 1 is a block diagram showing the configuration of an MCU according to a first embodiment.

A specific embodiment according to means for solving the problems will be specifically described below with reference to the accompanying drawings. In the drawings, the same elements are indicated by the same symbols and the repeated explanation thereof is optionally omitted to clarify a description.

For the convenience of explanation, the embodiment will be optionally described as a plurality of sections or embodiments. The sections or embodiments are relevant to one another unless otherwise specified. One of the sections or embodiments is, for example, a modification, an application, a detailed explanation, and a supplementary explanation of some or all of the other sections or embodiments. In the following embodiment, the number of elements (including a number, a numeric value, an amount, and a range) is not limited to a specific number unless otherwise specified or clearly limited to the specific number in theory. Thus, the number of elements may be larger or smaller than the specific number.

Furthermore, the constituent elements (including operation steps) of the following embodiment are not always necessary unless otherwise specified or clearly required in theory. Similarly, the shapes and positional relationships of constituent elements in the following embodiment substantially include the close or similar shapes of the constituent elements unless otherwise specified or clearly excluded in theory. This also holds for the number and so on (including a number, a numeric value, an amount, and a range).

The process of making the following embodiment will be described below. First, in an MCU, an internal power supply is not sufficiently supplied in response to sharp fluctuations in current during simultaneous operations in an installed module. Thus, a voltage drop or increase of Vdd instantly occurs. This leads to setup or hold violation of a flip-flop and causes a malfunction.

Figure 7:
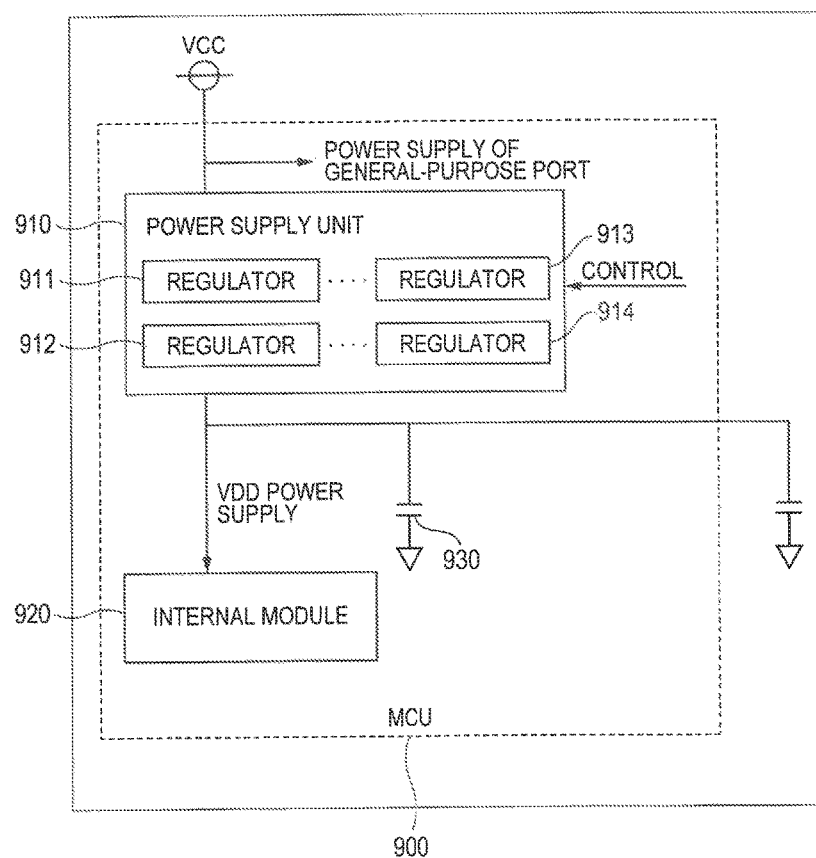
FIG. 7 is a block diagram showing a configuration example of an MCU according to the related art.

FIG. 7 is a block diagram showing a configuration example of an MCU 900 according to the related art for absorbing fluctuations of power supply. The MCU 900 includes a power supply unit 910 and an internal module 920. As solutions to a momentary voltage drop or increase of Vdd in the MCU 900, two measures are used as follows: the first measure is to provide a margin for the capacity of the power supply unit 910. Specifically, the number of internal regulators 911, 912, 913, and 914 of the power supply unit 910 is increased. The second measure is to add an MCU internal capacity 930 to a Vdd power supply line so as to absorb fluctuations of Vdd power supply.

However, these measures result in upsizing of chips, reducing cost competitiveness in the development of MCUs. For this reason, a voltage drop or increase of Vdd needs to be reduced by controlling, for example, simultaneous operations in the internal module of an MCU.

In the rush-current monitoring circuit of Japanese Unexamined Patent Application Publication No. 2008-218722, a ring oscillator oscillates according to a rush current passing through a circuit block to be monitored, and then the oscillatory frequency of the ring oscillator is measured by a counter. A disclosed translation table, in which the relationship between a count and a power-supply voltage level is determined beforehand, is formed in read-only memory.

Figure 8:
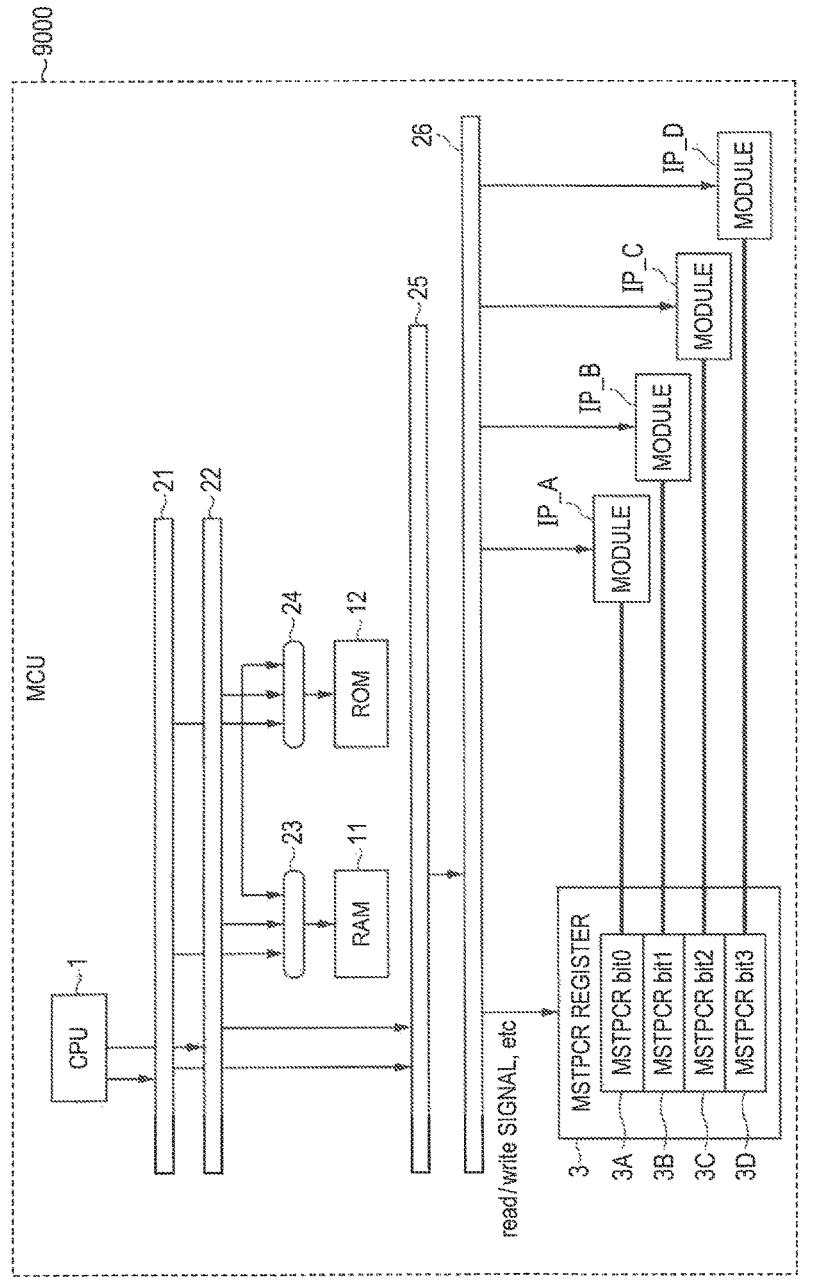
FIG. 8 is a block diagram showing the configuration of an MCU having a module stop function according to the related art.

Moreover, recently developed MCUs have a module stop function that can specify, through user programs, the order or timing of starting modules installed in MCUs. FIG. 8 is a block diagram showing the configuration of an MCU 9000 having a module stop function according to the related art. The MCU 9000 includes a central processing unit (CPU) 1, a random access memory (RAM) 11, a read-only memory (ROM) 12, an MSTPCR register 3, and modules IP_A, IP_B, IP_C, and IP_D.

The CPU 1 and the RAM 11 are coupled to each other via a command bus 21, an operand bus 22, and a memory bus 23. The CPU 1 and the ROM 12 are coupled to each other via the command bus 21, the operand bus 22, and a memory bus 24. The CPU 1, the MSTPCR register 3, and the module IP_A and so on are coupled to one another via the command bus 21, the operand bus 22, an inner main bus 25, and an inner peripheral bus 26.

The MSTPCR register 3 includes MSTPCR bits 3A, 3B, 3C, and 3D. The MSTPCR bits 3A to 3D are coupled to modules IP_A to IP_D, respectively, and hold 1-bit information indicating whether to start the respective modules.

The CPU 1 issues a writing command to each of the MSTPCR bits 3A to 3D by executing a user program. Thus, a value specified by the writing command is written in each of the MSTPCR bits 3A to 3D. Moreover, the CPU 1 issues a reading command to each of the MSTPCR bits 3A to 3D by executing a user program. Thus, the values of the MSTPCR bits 3A to 3D are read.

Figure 9:
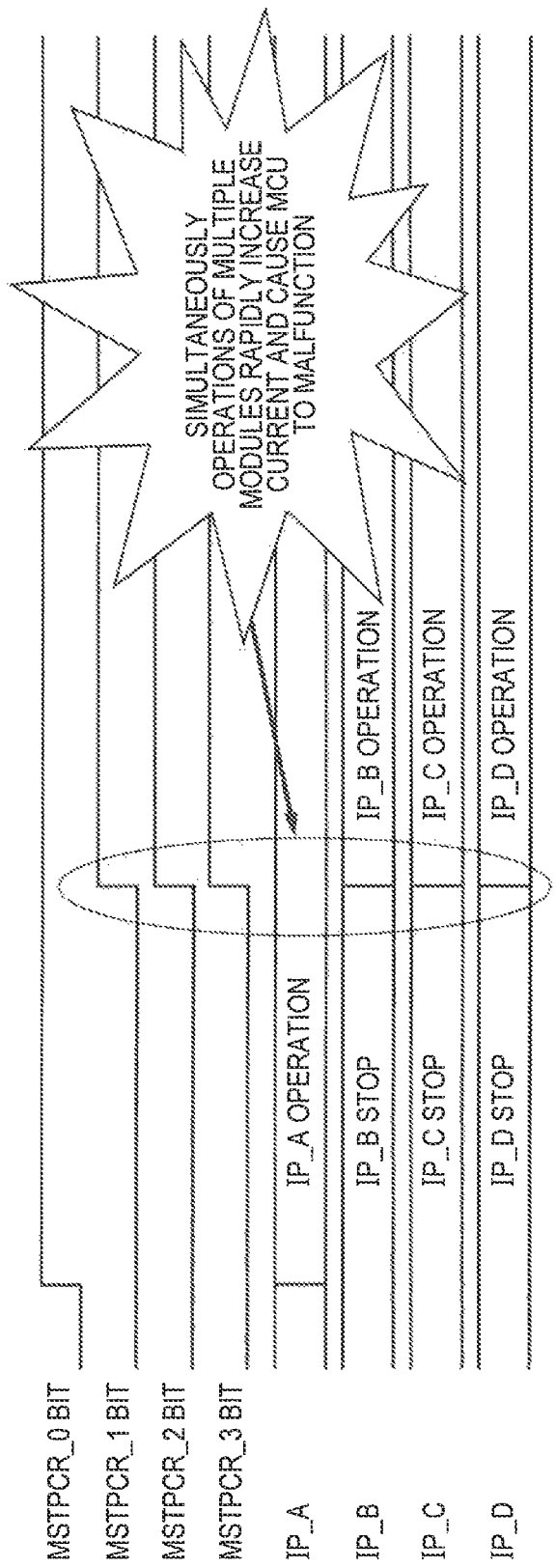
FIG. 9 is an explanatory drawing of a problem of module stop control according to the related art.

The modules IP_A to IP_D are activated in response to the values written in the respective MSTPCR bits 3A to 3D. FIG. 9 is an explanatory drawing of a problem of module stop control according to the related art.

For example, first, in response to an activation setting in the MSTPCR bit 3A according to a user program, the module IP_A is activated into an operating state. Subsequently, activation settings are simultaneously made in the MSTPCR bits 3B to 3D according to a user program. Thus, the modules IP_B to IP_D are simultaneously activated into an operating state. At this point, the activation of the modules IP_B to IP_D rapidly increases a current. This leads to setup or hold violation of a flip-flop in the MCU 9000 and causes a malfunction.

In order to prevent a malfunction, the timing of activation of the modules may be finely adjusted and specified in the user program, which may be considerably complicated because the modules are large in number. Thus, the modules may be actually activated in a concentrated manner (that is, the modules are activated at the same time) so as to cause a voltage drop/increase in response to a rush current.

The embodiment for solving the problem will be described below.

First Embodiment

FIG. 1 is a block diagram showing the configuration of an MCU 1000 according to a first embodiment. The MCU 1000 includes a CPU 1, an MSTPCR register 3, an operating-current indication circuit 4, a delay adjustment block 5, AND circuits 6A to 6D, and modules IP_A to IP_D. The CPU 1, the MSTPCR register 3, the delay adjustment block 5, and the modules IP_A to IP_D are coupled to one another via a bus 2. The bus 2 includes the command bus 21, the operand bus 22, the inner main bus 25, and the inner peripheral bus 26 of FIG. 8.

The MSTPCR register 3 includes flags FLG_A, FLG_B, FLG_C, and FLG_D in addition to the MSTPCR bits 3A, 3B, 3C, and 3D. The flags FLG_A to FLG_D are provided for the modules IP_A to IP_D, respectively. The flags FLG_A to FLG_D hold 1-bit information indicating the activation states of the respective modules IP_A to IP_D.

The delay adjustment block 5 is coupled to the MSTPCR register 3 and the AND circuits 6A to 6D. The delay adjustment block 5 includes delay adjustment units 5A to 5D. The outline of the delay adjustment units 5A to 5D will be explained and the detail thereof will be discussed later. The delay adjustment units 5A to 5D set delay times according to delay setting values dtA to dtD, respectively. In FIG. 1, a delay time of 1 microsecond is set for the delay adjustment unit 5A, a delay time of 2 microseconds is set for the delay adjustment unit 5B, a delay time of 3 microseconds is set for the delay adjustment unit 5C, and a delay time of 4 microseconds is set for the delay adjustment unit 5D. The delay times are not limited as long as at least the delay adjustment units vary in delay time. Thus, even if the activation of the MSTPCR bits 3A to 3D is specified at the same timing, the modules IP_A to IP_D can be activated at different times.

Moreover, the delay adjustment units 5A to 5D output the values of the MSTPCR bits 3A to 3D, respectively, to the AND circuits 6A to 6D. At this point, if a module stop control signal Mstp_ctrl indicates "1", the delay adjustment units 5A to 5D delay the values of the MSTPCR bits 3A to 3D, respectively, by the set delay times and then output the delayed values. Furthermore, the delay adjustment units 5A to 5D also feed back the output values to the flags FLG_A to FLG_D, respectively. In other words, the output values of the delay adjustment units 5A to 5D are set for the respective flags FLG_A to FLG_D.

The CPU 1 issues a reading command to each of the flags FLG_A to FLG_D and reads the values of a the flags FLG_A to FLG_D. If the read value is "1", the CPU 1 writes "0" in the flag.

The AND circuits 6A to 6D output the AND operation results of the input of clock signals clk_A to clk_D and the inputs of the delay adjustment units 5A to 5D to the modules IP_A to IP_D, respectively.

The operating-current indication circuit 4 receives values b[0] to b[3] of the MSTPCR bits 3A to 3D from the MSTPCR register 3 and the clock signals clk_A to clk_D, and outputs a module stop control signal Mstp_ctrl to the delay adjustment block 5. The module stop control signal Mstp_ctrl is an example of an instruction to activate the modules at different times.

Figure 2:
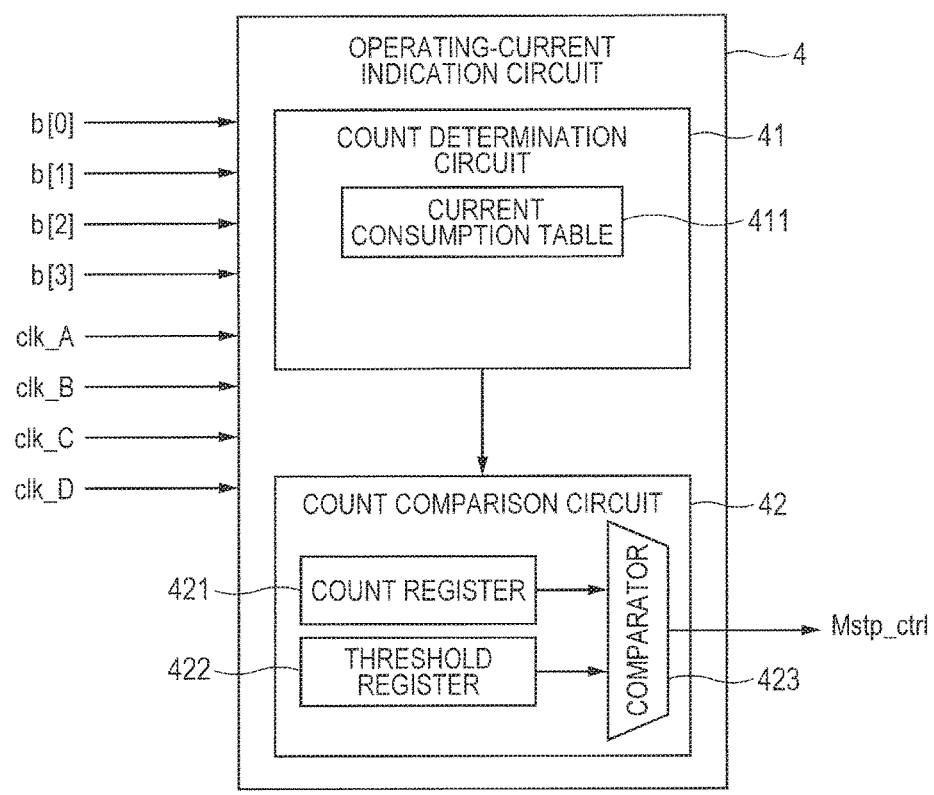
FIG. 2 is a block diagram showing the configuration of an operating-current indication circuit according to the first embodiment.

FIG. 2 is a block diagram showing the configuration of the operating-current indication circuit 4 according to the first embodiment. The operating-current indication circuit 4 includes a count determination circuit 41 and a count comparison circuit 42. The count determination circuit 41 is an example of a score specifying unit. The count determination circuit 41 includes a current consumption table 411.

The current consumption table 411 is information in which operating frequencies, current consumption values, and counts are correlated to one another for each of the modules. In this case, a current consumption value is the value of current consumed when the module operates at the operating frequency. A current consumption value at each operating frequency is determined as follows: first, a maximum current consumption value at a maximum operating frequency for each of the modules is measured beforehand. Subsequently, a current consumption value at each of the operating frequencies predicted in the modules is determined according to the ratio of the operating frequency to the maximum operating frequency. Moreover, the count (an example of a score) is a value determined beforehand according to the ratio of the current consumption value to the allowable current specification of the MCU 1000 and the significance of the module in the MCU 1000. Each count is determined such that the sum of the maximum counts of the modules is 100.

Figure 3:
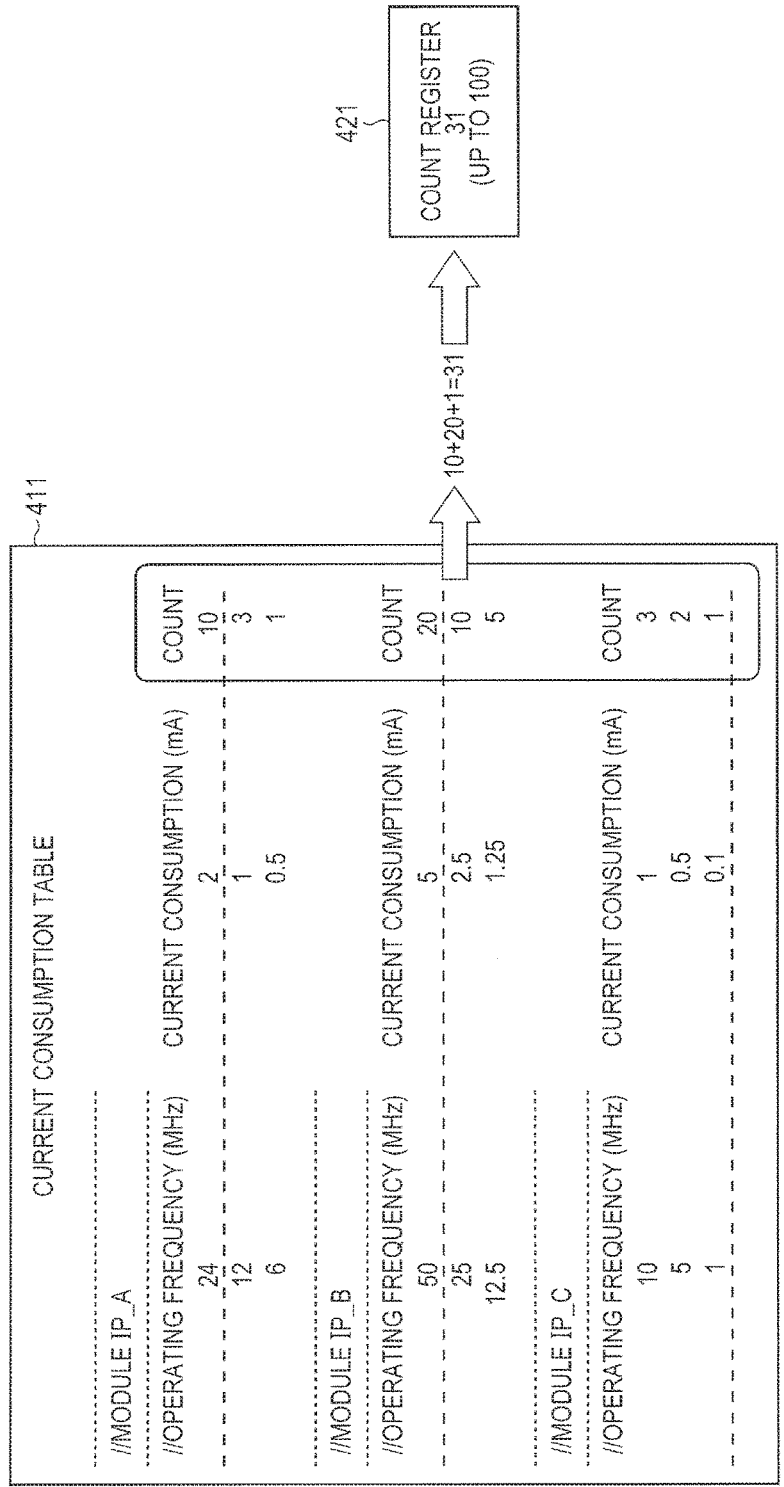
FIG. 3 shows an example of a current consumption table according to the first embodiment.

FIG. 3 shows an example of the current consumption table 411 according to the first embodiment. For example, the maximum operating frequency of the module IP_A is 24 MHz and the maximum current consumption value of the module IP_A operated at 24 MHz is 2 mA. Subsequently, a count "10" is assigned to the current consumption value of 2 mA in the module IP_A by a user based on the allowable current specification of the MCU 1000. Predicted operating frequencies other than the maximum operating frequency in the module IP_A are 12 MHz and 6 MHz. The operating frequencies are assigned with current consumption values of 1 mA and 0.5 mA, respectively, according to the ratios of the operating frequencies to the maximum operating frequencies. Furthermore, a count "3" is assigned to the operating frequency of 12 MHz and the current consumption value of 1 mA by the user and a count "1" is assigned to the operating frequency of 6 MHz and the current consumption value of 0.5 mA by the user.

The count determination circuit 41 calculates the operating current values of the modules based on the operating states (b[0] to b[3]) of the modules and the operating frequencies of the modules, and then refers to the current consumption table 411 to read the counts associated with the calculated operating current values. Subsequently, the count determination circuit 41 stores the sum of the read counts of the modules in a count register 421 of the count comparison circuit 42.

The operating states of the modules are equivalent to the values of b[0] to b[3] inputted from the MSTPCR bits 3A to 3D. "0" indicates a stop while "1" indicates an action. Moreover, the operating frequencies of the modules are determined by counting the clock signals clk_A to clk_D. Alternatively, the operating frequencies of the modules may be operating frequency values stored in a predetermined register (not shown) by the CPU 1.

The count determination circuit 41 calculates an operating current value according to the following equation:

An operating current value=the operating state of the module×the maximum current consumption of the module×(the operating frequency of the module/the maximum operating frequency of the module)

FIG. 3 shows the process of calculating the sum of counts when the operating frequencies of the modules IP_A to IP_C are 24 MHz, 50 MHz, and 1 MHz, b[0] to b[2] are 1, and b[3] is 0.

The count comparison circuit 42 is an example of an output unit. The count comparison circuit 42 includes the count register 421, a threshold register 422, and a comparator 423. The count register 421 holds a sum calculated by the count determination circuit 41. The threshold register 422 holds a threshold value for a comparison with the sum of counts. The comparator 423 compares the sum of counts in the count register 421 and the threshold value in the threshold register 422. If the sum exceeds the threshold value, the module stop control signal Mstp_ctrl set at "1" is outputted to the delay adjustment block 5.

The current consumption table 411, the count register 421, and the threshold register 422 are accessible from the CPU 1. In the current consumption table 411 and the threshold register 422, particularly, values are set beforehand. The count determination circuit 41 calculates the sum of counts each time the values of b[0] to b[3] are updated, and then the sum is added to a value stored in the count register 421. In the above explanation, counts are combined. A count may be subtracted from a predetermined value.

Figure 4:
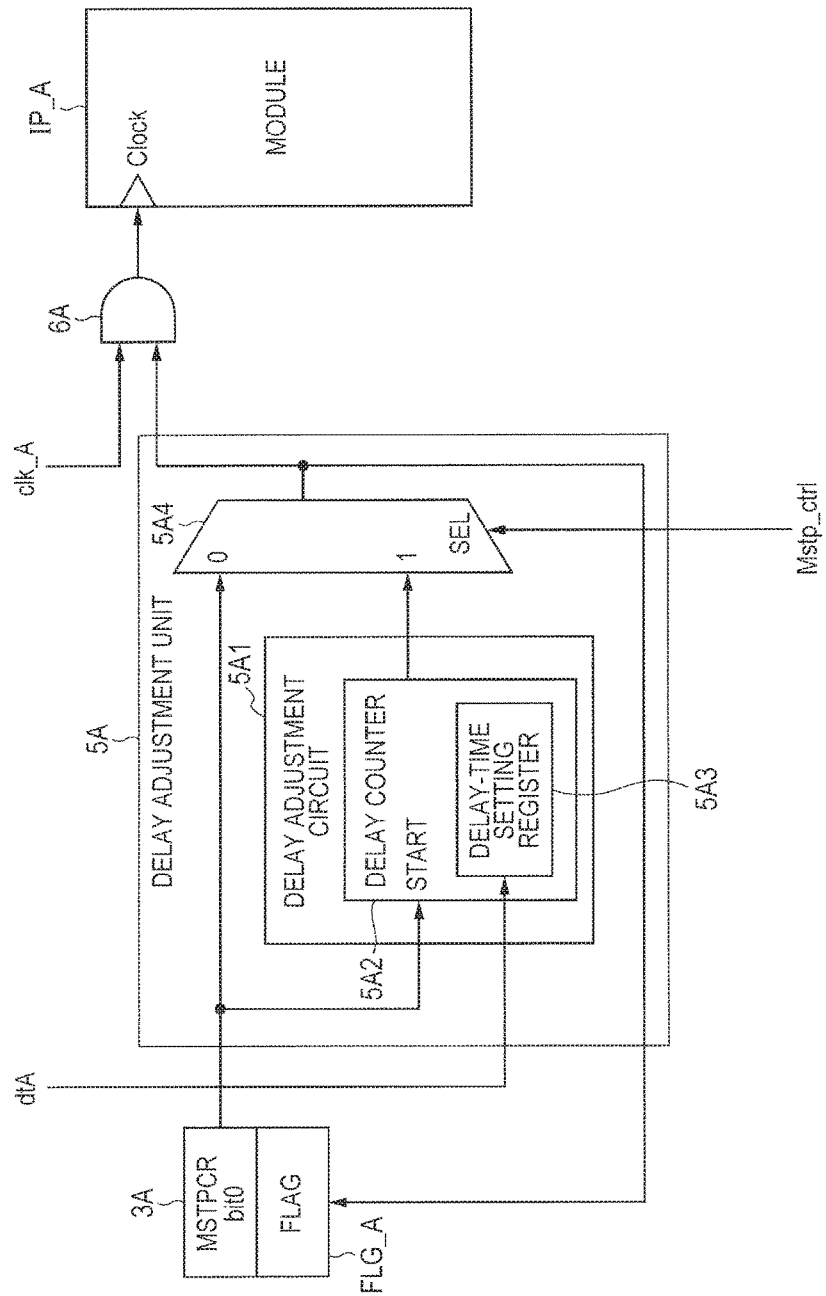
FIG. 4 is a block diagram showing the configuration of a delay adjustment unit according to the first embodiment.

FIG. 4 is a block diagram showing the configuration of the delay adjustment unit 5A according to the first embodiment. The configurations of the delay adjustment units 5B to 5D are identical to that of the delay adjustment unit 5A and thus the drawings and explanation thereof is omitted. The delay adjustment unit 5A includes a delay adjustment circuit 5A1 and a selection circuit 5A4. The delay adjustment circuit 5A1 includes a delay counter 5A2. The delay counter 5A2 includes a delay-time setting register 5A3. The delay-time setting register 5A3 holds a delay setting value dtA specified from the CPU 1. If the MSTPCR bit 3A is "1", the delay counter 5A2 starts a counter and outputs a signal to the selection circuit 5A4 after counting of the set value of the delay-time setting register 5A3. The selection circuit 5A4 outputs the value of the MSTPCR bit 3A as it is if the module stop control signal Mstp_ctrl is "0". The selection circuit 5A4 outputs the signal from the delay adjustment circuit 5A1 if the module stop control signal Mstp_ctrl is "1". The delay adjustment unit 5A outputs the output of the selection circuit 5A4 to the AND circuit 6A and the flag FLG_A.

Specifically, if the module stop control signal Mstp_ctrl is "0", the delay adjustment unit 5A activates the module IP_A when the CPU 1 sets "1" in the MSTPCR bit 3A. If the module stop control signal Mstp_ctrl is "1", the delay adjustment unit 5A activates the module IP_A at a time delayed by the setting value of the delay-time setting register 5A3 from the timing of the setting of "1" in the MSTPCR bits 3A by the CPU 1.

Since the delay adjustment units 5A to 5D hold the different delay setting values dtA to dtD, even if any combinations of the modules IP_A to IP_D are set by the CPU 1 so as to simultaneously activate, the activation of the modules IP_A to IP_D can be shifted if the module stop control signal Mstp_ctrl is "1".

Moreover, in the flags FLG_A to FLG_D, "1" is set at the time of activation in consideration of the delays of the modules IP_A to IP_D. Thus, the CPU 1 can read the flags FLG_A to FLG_D and recognize the timing of activation of the modules by executing the user program. If the read values of the flags FLG_A to FLG_D are "1", the CPU 1 rewrites "1" to "0" by executing the user program. Moreover, the MCU 1000 may include a predetermined circuit (not shown) that is updated to "0" after the values of "1" in the flags FLG_A to FLG_D are read.

Figure 5:
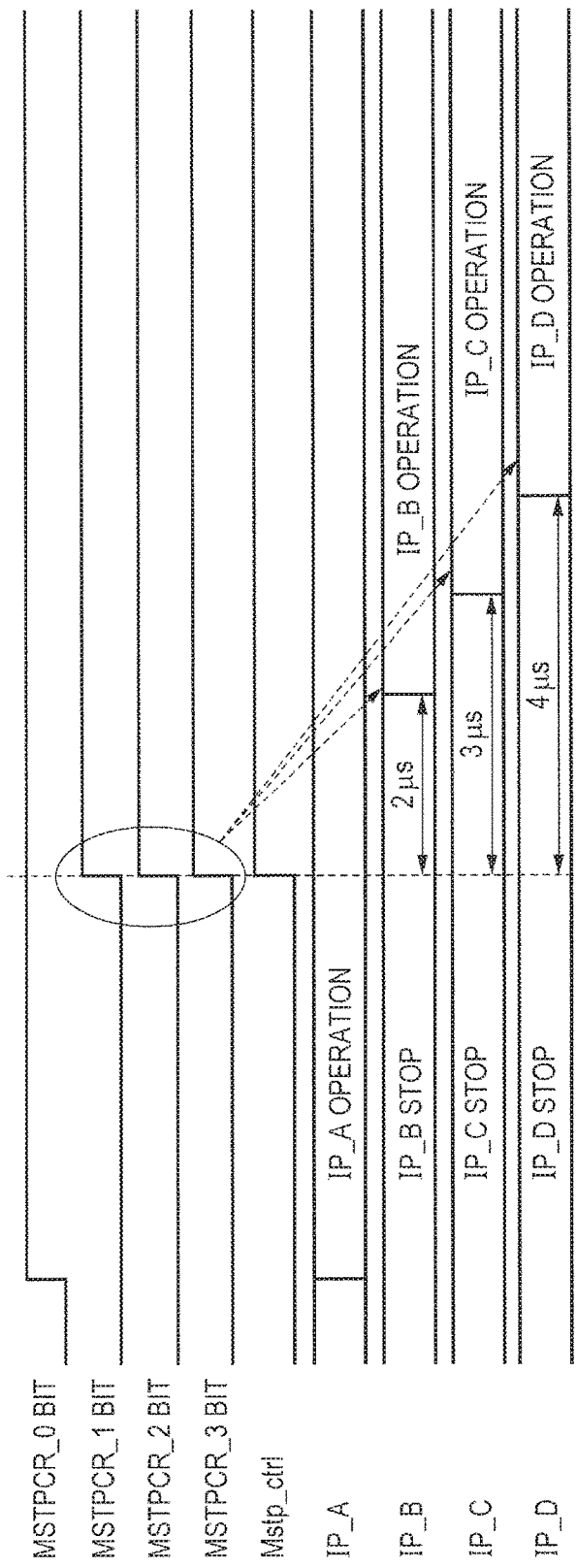
FIG. 5 is a timing chart showing module stop control according to the first embodiment.

FIG. 5 is a timing chart showing module stop control according to the first embodiment. First, when the MSTPCR bit 3A is set at "1", the module stop control signal Mstp_ctrl is "0". Thus, any delay is not found in the delay adjustment unit 5A and the module IP_A is activated into an operating state without delay. After that, the MSTPCR bits 3B to 3D are simultaneously set at "1". In this case, the value of the count register 421 exceeds the value of the threshold register 422 in the operating-current indication circuit 4. Thus, the module stop control signal Mstp_ctrl is set at "1" and the delay adjustment units 5B to 5D set delays of 2 microseconds, 3 microseconds, and 4 microseconds, respectively. This activates the modules IP_B to IP_D at different times.

Figure 6:
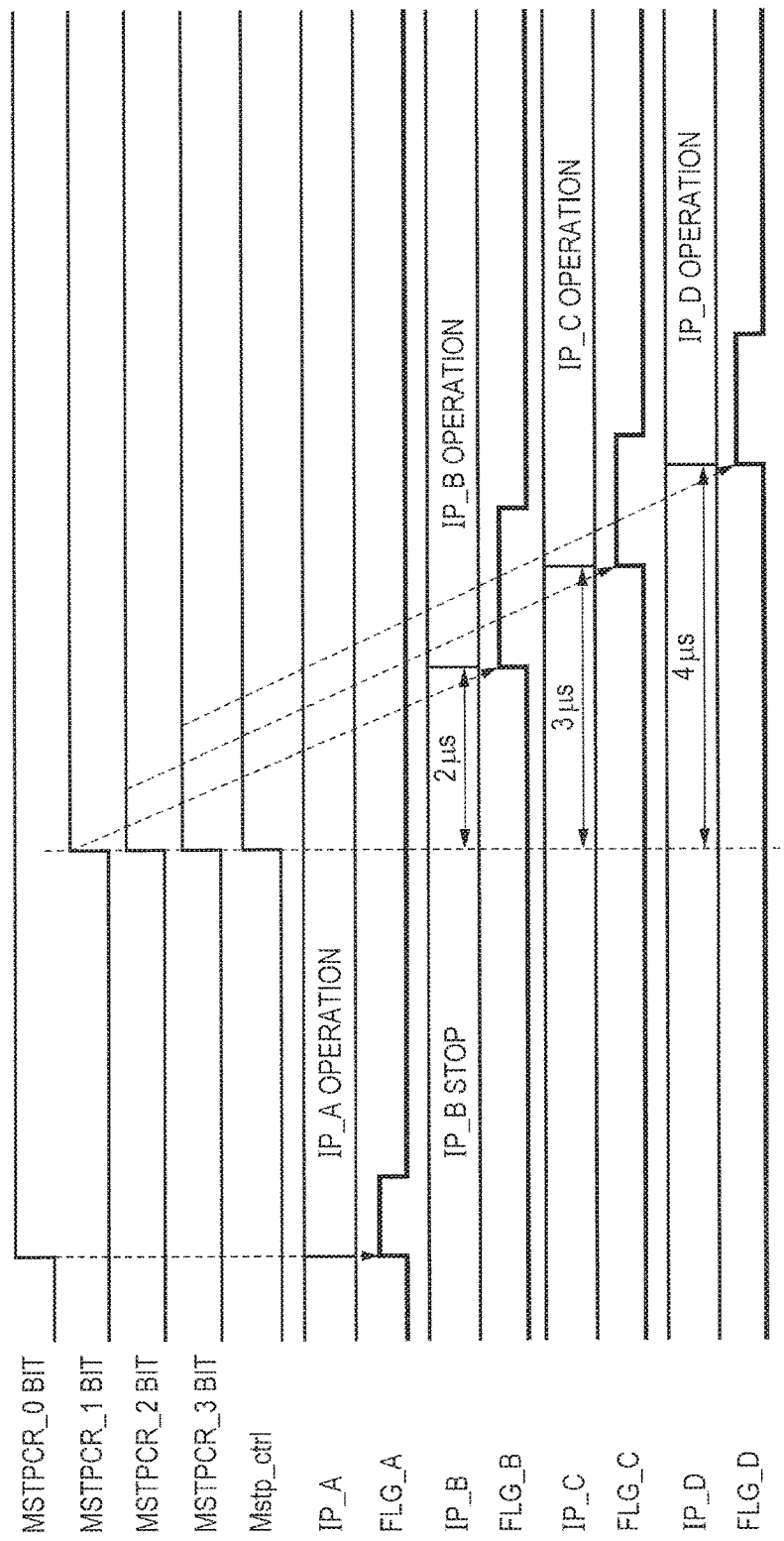
FIG. 6 is a timing chart showing module stop control according to the first embodiment.

FIG. 6 is a timing chart showing module stop control according to the first embodiment. FIG. 6 shows the states of the flags FLG_A to FLG_D in the case of FIG. 5. Since the activation of the module IP_A is not delayed, the flag FLG_A is set at "1" when the MSTPCR bit 3A becomes "1". Since the activation of the module IP_B is delayed, the flag FLG_B is set at "1" in 2 microseconds after the MSTPCR bit 3B becomes "1". The flags FLG_C and FLG_D are also set at "1" in 3 and 4 microseconds, respectively, after the MSTPCR bits 3C and 3D become "1". As described above, the flags FLG_A to FLG_D set at "1" are read by the CPU 1 and then are updated to "0".

According to the above explanation, the current consumption table and the threshold value are set for each MCU or system-on-a-chip (SOC) product, so that the present embodiment can prevent a malfunction caused by sharp fluctuations in current.

Moreover, a margin to be obtained for the capacity of the power supply unit can be reduced unlike in the development of MCUs in the related art. This can achieve a small chip size and cost competitive MCUs. Furthermore, the operating-current indication circuit can constitute a logic circuit (logic) and can be widely used for MCU or SOC products with high cost competitiveness.

The current consumption table is widely available with a small change in the development of MCU or SOC products. Moreover, the threshold register is provided so as to set a threshold value (allowable current consumption value) suitable for each MCU or SOC product. In other words, the development of MCU products is facilitated (with extended ROM and an additional module) only by changing or adding values in the current consumption table.

Furthermore, the count register (operating current value) can be read from the CPU, allowing monitoring of the operating current state of an MCU or SOC product from user software.

Moreover, a momentary voltage drop or increase of Vdd is caused by simultaneous operations of the modules and leads to a malfunction of the MCU. The voltage drop or increase can be suppressed by actuating the modules at different times by means of the delay adjustment circuit. The delay adjustment circuit can set a delay time for each of the modules and activate the modules in the order of priority.

According to the present embodiment, unlike in the current consumption table 411, a current consumption value does not always need to be held as a value in a table. In this case, it is only necessary to store at least multiple operating frequencies in the modules and scores determined based on the operating frequencies such that the operating frequencies and the scores are associated with each other in the respective modules.

The MSTPCR bits 3A to 3D are examples of module activation control registers for controlling the activation of modules. The flags FLG_A to FLG_D are examples of flag registers that are provided for the respective delay adjustment circuits and hold outputs from the respective delay adjustment circuits.

The present embodiment has the following aspects: a semiconductor device including a plurality of modules, the semiconductor device including:

a table that stores a plurality of operating frequencies in each of the modules and a plurality of scores determined based on the operating frequencies such that the operating frequencies and the scores are associated with each other for each of the modules;

a score specifying unit that acquires the clock operating frequencies of the modules and specifies the scores based on the clock operating frequencies with reference to the table; and an output unit that outputs an instruction to activate the modules at different times if the specified scores exceed a predetermined threshold value.

Thus, even at the same operating frequency in the same module, a different score can be flexibly set for each product of the semiconductor device, thereby activating the modules at different times.

The scores are desirably values determined based on current consumption values required when the modules associated with the scores are operated at the operating frequencies associated with the scores. Thus, the modules can be activated at different times in response to sharp fluctuations in operating current.

Moreover, the score is desirably a value determined based on the significance of the module in the semiconductor device or the allowable current specification of the semiconductor device. Thus, even in the case of the same current consumption value of the same module, the score can be flexibly set according to the allowable current specification of a product of the semiconductor device.

The semiconductor device preferably further includes a threshold register that stores the predetermined threshold value. Thus, the threshold value can be flexibly set according to a product of the semiconductor device.

The semiconductor device desirably further includes a plurality of module activation control registers for controlling the activation of the modules.

The table stores current consumption values required for operating the modules at the operating frequencies, the current consumption values being associated with the respective modules, and the score specifying unit calculates the current consumption values of the modules based on the values of the module activation control registers and the clock operating frequencies, and specifies the scores associated with the calculated current consumption values.

This can predict a current consumption value in the module instructed to activate, thereby avoiding concentrated activation. Moreover, module stop control can be performed.

The semiconductor device desirably further includes a plurality of delay adjustment circuits provided for the respective modules.

The delay adjustment circuit delays the value of the module activation control register by a predetermined time and outputs the value to the corresponding module based on the instruction.

The predetermined time desirably varies among the delay adjustment circuits. Thus, the modules can be activated at different times in response to module stop control.

Each of the delay adjustment circuits preferably includes a delay-time setting register that allows the setting of the predetermined time from the outside. Thus, variations in the timing of activation of the modules can be flexibly adjusted.

The semiconductor device preferably further includes a flag register that is provided for each of the delay adjustment circuits and holds an output from the corresponding delay adjustment circuit. Thus, the timing of activation can be recognized from the outside (e.g., a CPU).

A method of controlling a semiconductor device according to the present embodiment, the semiconductor device including a table that stores a plurality of operating frequencies in a plurality of modules and a plurality of scores determined based on the operating frequencies such that the operating frequencies and the scores are associated with each other for each of the modules, the method including the steps of:

acquiring the clock operating frequencies of the modules;

specifying the scores based on the clock operating frequencies with reference to the table; and outputting an instruction to activate the modules at different times if the specified scores exceed a predetermined threshold value.

Thus, even at the same operating frequency in the same module, a different score can be flexibly set for each product of the semiconductor device, thereby activating the modules at different times.

The invention made by the present inventors was specifically described above. Obviously, the present invention is not limited to the embodiment and can be changed in various ways within the scope of the invention.

What is claimed is:

1. A semiconductor device comprising a plurality of modules, the semiconductor device comprising:

a table that stores a plurality of operating frequencies for each of the modules and a plurality of scores determined based on the operating frequencies such that the operating frequencies and the scores are associated with each other for each of the modules;

a score specifying unit that acquires clock operating frequencies of the modules and specifies the scores based on the clock operating frequencies with reference to the table; and an output unit that outputs an instruction to activate the modules at different times if the specified scores exceed a predetermined threshold value.

2. The semiconductor device according to claim 1, wherein the scores are values determined based on current consumption values required when the modules associated with the scores are operated at the operating frequencies associated with the scores.

3. The semiconductor device according to claim 1, wherein the scores are values determined based on the significance of the respective modules in the semiconductor device or an allowable current specification of the semiconductor device.

4. The semiconductor device according to claim 1, further comprising a threshold register that stores the predetermined threshold value.

5. The semiconductor device according to claim 1, further comprising a plurality of module activation control registers for controlling activation of the modules, wherein the table stores current consumption values required for operating the modules at the operating frequencies, the current consumption values being associated with the respective modules, and wherein the score specifying unit calculates the current consumption values of the modules based on values of the module activation control registers and the clock operating frequencies, and specifies the scores associated with the calculated current consumption values.

6. The semiconductor device according to claim 5, further comprising a plurality of delay adjustment circuits provided for the respective modules, wherein the delay adjustment circuits delay the values of the module activation control registers by respective predetermined times and output the values to the corresponding modules based on the instruction, and wherein the predetermined times vary among the delay adjustment circuits.

7. The semiconductor device according to claim 6, wherein each of the delay adjustment circuits includes a delay-time setting register that allows setting of the predetermined time from outside.

8. The semiconductor device according to claim 6, further comprising a flag register that is provided for each of the delay adjustment circuits and holds an output from the corresponding delay adjustment circuit.

9. A method of controlling a semiconductor device comprising a table that stores a plurality of operating frequencies for a plurality of modules and a plurality of scores determined based on the operating frequencies such that the operating frequencies and the scores are associated with each other for each of the modules, the method comprising:

acquiring the clock operating frequencies of the modules;

specifying the scores based on the clock operating frequencies with reference to the table; and outputting an instruction to activate the modules at different times if the specified scores exceed a predetermined threshold value.

* * * * *